United States Patent
Hirayanagi

(12) 
(10) Patent No.: US 6,521,900 B1
(45) Date of Patent: Feb. 18, 2003

(54) ALIGNMENT MARKS FOR CHARGED-PARTICLE-BEAM MICROLITHOGRAPHY, AND ALIGNMENT METHODS USING SAME

(75) Inventor: Noriyuki Hirayanagi, Suginami-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/518,431

(22) Filed: Mar. 3, 2000

(30) Foreign Application Priority Data

Mar. 3, 1999 (JP) .......................................... 11-055366

(51) Int. Cl.$^7$ ............................................. H01J 37/304
(52) U.S. Cl. ................ 250/491.1; 250/492.1; 250/492.22
(58) Field of Search ........................... 250/442.11, 398, 250/492.22, 492.3, 505.1, 492.1, 491.1, 492.21

(56) References Cited

U.S. PATENT DOCUMENTS

| | | | |
|---|---|---|---|
| 4,769,551 A | * 9/1988 | Hamashima et al. | ........ 250/548 |
| 4,962,318 A | 10/1990 | Nishi | |
| 5,148,036 A | * 9/1992 | Matsugu et al. | ............ 250/548 |
| 5,168,166 A | * 12/1992 | Hayakawa et al. | ...... 250/492.2 |
| 5,477,309 A | * 12/1995 | Ota et al. | ..................... 355/67 |

OTHER PUBLICATIONS

Farrow et al., "Mark Detection for Alignment and Registration in a High–Throughput Projection Electron Lithography Tool," *J. Vac. Sci. Technol.* 10:2780–2783 (1992).

* cited by examiner

*Primary Examiner*—John R. Lee
*Assistant Examiner*—David A. Vanore
(74) *Attorney, Agent, or Firm*—Klarquist Sparkman LLP

(57) ABSTRACT

Alignment marks and methods using such marks are provided for use in charged-particle-beam (CPB, e.g., electron-beam) microlithography. The alignment marks are capable of being detected by both an optical-based alignment-mark sensor and a CPB-based alignment-mark sensor. A representative embodiment of such an alignment mark comprises multiple serially arrayed elements having a first period. At least one of the elements comprises multiple serially arrayed sub-elements having a second period that is shorter than the first period. When such a mark is sensed using an optical-based sensor, the period of the sub-elements is not resolvable and the resulting signal will be substantially the same as when none of the elements is subdivided into sub-elements. However, when such a mark is sensed using a CPB-based sensor and scanning the charged particle beam, then the period of the sub-elements is resolvable. Hence, a single alignment mark can be detected using either type of sensor.

24 Claims, 4 Drawing Sheets

ALIGNMENT MARKS FOR CHARGED-PARTICLE-BEAM MICROLITHOGRAPHY, AND ALIGNMENT METHODS USING SAME

FIELD OF THE INVENTION

The present invention pertains to microlithography methods and apparatus as used, for example, in manufacturing semiconductor integrated circuits and displays, wherein a pattern defined by a mask or reticle is transferred to a substrate such as a semiconductor wafer. More specifically, the invention pertains to alignment marks and alignment methods used for aligning the position of the substrate relative to, for example, the reticle or a reticle stage on which the reticle is mounted. The methods and apparatus can be used in optical microlithography and/or microlithography performed using a charged particle beam (e.g., electron beam).

BACKGROUND OF THE INVENTION

In microlithography systems, positional alignment between a reticle or reticle stage and a substrate (e.g., wafer) being processed is achieved by using alignment sensors to detect the respective locations of alignment marks provided on the stage and on the substrate. One type of conventional optical-based alignment sensor is a two-dimensional image sensor such as a charge-coupled device ("CCD"). Such a sensor can be used for sensing an alignment mark comprising lines formed in a periodic line/space (L/S) pattern on the substrate. Image processing can be performed to determine the location of the center of the reticle, for example.

In reduced-image type electron-beam microlithography, a "reduced" (demagnified) image of a reticle pattern is projected onto a substrate. Alignment sensors in such systems employ an electron beam to perform positional sensing of an alignment mark on the substrate. The alignment mark comprises lines arranged in a periodic array. The mark is sensed in a manner similar to positional sensing performed optically. An alignment-mark pattern, corresponding to the alignment-mark pattern defined on the substrate, is provided on the reticle. A reduced (demagnified) image of the alignment-mark pattern on the reticle is projected onto the substrate by the electron beam as the electron beam scans the corresponding mark pattern on the substrate. Impingement of the electron beam on the alignment mark on the substrate generates backscattered electrons. The backscattered electrons are detected by a backscattered-electron (BSE) detector that generates a corresponding electrical signal having a signal waveform that is processed to determine the location of the center of the alignment mark.

Further details of conventional alignment-sensing methods, as summarized above, using an electron beam are depicted in FIGS. 5(a) and 5(b) and described further below. In FIG. 5(a), elements of an image (as formed on the substrate) of an alignment-mark pattern as defined on a reticle or reticle stage are denoted by the reference numeral 3. The reference number 4 denotes features ("elements") of a corresponding alignment mark defined (e.g., in a layer of heavy metal or the like) on the substrate or substrate stage. For simplicity, only two elements of the alignment-mark pattern are shown; however, it will be understood that an actual alignment mark on the reticle and the corresponding alignment mark on the substrate each comprise many elements. In FIG. 5(a), the image of each element 3 (as formed on the substrate) has a width of 0.2 $\mu$m and a pitch ("period") of 0.6 $\mu$m. These dimensions are the same as the corresponding dimensions of the elements 4 on the substrate.

As an alignment mark (defining the elements 3) on the reticle is irradiated by an electron beam, images of the alignment-mark elements 3 are formed on the substrate. Meanwhile, the electron beam is deflected, using a deflector, as required to scan the images of the alignment-mark elements 3 across the elements 4 of the corresponding alignment mark on the substrate (scanning is performed in the horizontal direction in the figure). At moments during such scanning, overlaps occur (on the substrate) of the alignment-mark elements 4 with the images of the alignment-mark elements 3. Backscattered or secondary electrons are emitted from regions of overlap. The number of backscattered electrons actually produced is generally proportional to the surface area of the overlap of the alignment-mark elements 4 with the alignment-mark elements 3 on the substrate. The corresponding signal waveform produced by a BSE detector is shown in FIG. 5(b), representing a signal waveform produced when the mark on the reticle and the mark on the substrate each have five elements 3, 4, respectively.

By locating a point in the scan at which the output from the BSE detector is maximum (i.e., the center, or "center of gravity," of the detector-output waveform), the corresponding point at which the elements 3 of the alignment-mark image are superposed on the elements 4 of the alignment mark on the substrate is determined. Meanwhile, the magnitude of beam deflection is monitored. From the magnitude of beam deflection at the point of superposition, the relative positions of the reticle and substrate can be determined.

In semiconductor-device fabrication, it is sometimes necessary to employ both electron-beam microlithography and optical microlithography, depending upon the type of device being fabricated. Some conventional electron-beam microlithography systems utilize optical alignment sensors ("optical-based sensors"; i.e., sensors employing light) in addition to alignment sensors that employ a charged particle beam ("CPB-based sensors"). Whenever semiconductor devices are being fabricated on a wafer, the position of a wafer with one type of layer may be detected more accurately using an optical-based sensor, whereas position of a wafer with another type of layer may be detected more accurately using a CPB-based sensor. Under such conditions, it is desirable to be able to perform alignments using the particular alignment sensor (optical-based or CPB-based) that will provide the more accurate measurement for the particular layer. It is also desirable to be able to detect the same alignment marks using both types of sensors.

In electron-beam microlithography apparatus that include both an optical-based sensor and a CPB-based sensor, the CPB-based sensor is situated inside the CPB "column" (vacuum chamber housing the array of lenses and deflectors of the CPB-optical system), but the optical-based sensor normally is situated outside the CPB column. With such a configuration, alignments performed using the optical-based sensor require that the distance between the respective centers of each of the two sensor systems be accurately known or measured. The most accurate way to measure the positions of the two sensors is to measure an alignment mark using the optical-based alignment sensor, measure the same mark using the CPB-based sensor, and then measure the distance traversed by the stage between the two measured positions. To perform such a measurement, however, an alignment mark is required that can be detected by both types of sensors.

With a line-and-space (L/S) alignment mark comprising elements with a period of approximately 6 $\mu$m, for example, it is possible for the same mark to be detected by both an optical-based alignment sensor and a CPB-based sensor. With mark-sensing methods that employ an electron beam, however, it is best to keep the range over which the mark is scanned by the electron beam (i.e., the beam-scan step) as small as possible. Limiting the beam-scan step improves detection accuracy and reduces possibly adverse effects of the electron beam on areas surrounding the mark. However, the array of elements of the alignment mark has a period of 6 µm, for example, a beam-scan step of approximately 6 µm normally is required. Such a large beam-scan step creates problems in that an excessively large number of data points is required to obtain the necessary detection accuracy. Also, an electron beam scanned over such a large area can exert various unwanted side effects on neighboring structure.

SUMMARY AND GENERAL ASPECTS OF THE INVENTION

In view of the shortcomings of the prior art summarized above, an object of the invention to provide an alignment mark that can be detected by both an optical-based alignment sensor and a CPB-based alignment sensor. Another object is to provide an alignment mark that, when detected using a CPB-based alignment sensor, is capable of being detected without having to use a large beam-scan step or a large number of data points. Yet another object is to provide alignment methods that employ such alignment marks.

In general, an alignment mark according to the invention is usable for performing alignment in a charged-particle-beam ("CPB", e.g., electron-beam) microlithography apparatus. The mark is preferably of a line-and-space (L/S) configuration comprising any of various combinations of elements and sub-elements that are resolvable for detection by both an optical-based alignment-mark sensor and a CPB-based alignment-mark sensor. Because such an alignment mark is suitable for detection by both types of alignment-mark sensors, the mark can be used, e.g., for measuring the distance between the optical-based alignment-mark sensor and the CPB alignment-mark sensor and for performing "coarse" and "fine" alignments of the reticle and substrate. Also, in device-fabrication processes involving substrates such as semiconductor wafers, the particular sensor that actually is used can be the sensor that provides the best accuracy under the prevailing conditions.

According to a representative embodiment, an alignment mark according to the invention comprises a plurality of identically shaped mark elements each desirably having a linearly extended configuration. The elements desirably are parallel to each other. According to a general configuration, the elements desirably are serially arranged in a prescribed pattern in which the elements are spaced apart from one another by a spacing interval that is at least a first prescribed value. Each element can comprise multiple linear sub-elements arranged in a prescribed pattern in which the sub-elements are spaced apart from one another by a spacing interval that is no greater than a second prescribed value. The second prescribed value is less than the first prescribed value.

With such an alignment mark, whenever an optical-based alignment-mark sensor (e.g., FIA sensor) is used to detect the mark, the location of the center of the alignment mark can be determined by optically detecting the locations of the elements of the alignment mark relative to the corresponding index mark of the optical-based sensor. Image processing is performed to find the center of the mark. Because the sub-elements are arranged in a prescribed pattern and spaced apart from one another by a spacing interval that is less than the second prescribed value, the sub-elements are detected only as a very weak signal by the optical-based sensor. I.e., the optical-based sensor detects the alignment mark as a group of elements only, wherein each element has the overall shape of a respective constituent element of the alignment mark. The elements are arranged in a prescribed pattern having a spacing therebetween that is greater than the first prescribed value. Hence, the sub-elements that make up each of the elements are not sensed as significant noise by the optical-based alignment-mark sensor.

An alignment mark as summarized above that is detectable using an optical-based alignment-mark sensor also can be detectable using a CPB-based alignment-mark sensor. To such end, the sub-elements of the mark pattern on the reticle desirably are arrayed at a period that is less than the period at which the elements of the alignment mark are arrayed. For sensing, a charged particle beam that has passed through such an alignment mark on the reticle (or reticle stage) is scanned across a corresponding pattern of alignment-mark elements and sub-elements on the substrate (or substrate stage). A backscattered-electron (BSE) signal waveform obtained during such scanning is processed to determine the location of the center of the alignment mark. Thus, whenever a CPB-based alignment sensor is used, a narrow beam scan width can be used to determine the location of the center of the alignment mark. I.e., the charged particle beam can be scanned over a width encompassing one mark element (with sub-elements), or less, rather than the entire mark.

In the configuration summarized above, and in other configurations according to the invention, spacing intervals between pairs of adjacent sub-elements need not be equal.

In an alternative configuration, the alignment mark comprises multiple identically shaped elements. The elements are arranged in a prescribed serial array in which the spacing interval between elements is at least a first prescribed value. At least one of the elements comprises multiple sub-elements serially arranged in an array in which the spacing interval is no greater than a second prescribed value that is less than the first prescribed value. When scanning such an alignment mark with a charged particle beam, the narrower the scan width of the beam that is used, the better. The scan width can be as narrow as one element of the mark. Hence, it is not necessary for every element in an alignment mark according to the invention to comprise multiple sub-elements. Rather, it is sufficient if at least one of the elements comprises multiple sub-elements.

In stating that elements of alignment marks according to the invention be identically shaped, this is not to be construed to mean that the elements are identical down to the smallest microscopic detail. Rather, it is sufficient that the elements be similar in a macroscopic sense (i.e., the elements are similar at least at the "element" level such that they appear similar by the optical-based sensor). Whenever such elements are detected using an optical-based sensor, the signals obtained from the various elements are essentially similar.

In yet another configuration of an alignment mark according to the invention, the sub-elements are spaced apart from one another by a spacing interval that is less than what is resolvable by the optical-based sensor and greater than the minimum beam-scan step (increment of beam scan) of the CPB-based sensor. The spacing interval between the alignment-mark elements is greater than the resolution limit of the optical-based sensor. Because the spacing interval between the sub-elements is less than the resolution limit of the optical-based sensor, the optical-based sensor is used to detect the alignment-mark elements as a pattern in which the sub-elements are not resolvable. Hence, the sub-elements are not a source of significant noise during detection using the optical-based sensor, which improves the detection accuracy of the optical-based sensor. However, because the spacing interval between individual sub-elements is greater than the minimum beam-scan step of the CPB-based sensor, the CPB-based sensor can be used to accurately detect the location of the center of the array of sub-elements making up the mark. Also, because the spacing interval between the alignment-mark elements is greater than the resolution limit of the optical-based sensor, the location of the alignment marks can be accurately detected using the optical-based alignment-mark sensor.

Hence, as summarized above, alignment-mark detection can be performed using an appropriate sensor selected from optical-based sensors and CPB-based sensors, or using both types of sensors. For example, a mark on the wafer stage can be detected by FIA (optical-based sensor) and using a CPB-based sensor, allowing a determination of the distance between the axis of the FIA sensor and the axis of the CPB-based sensor. In a "coarse" adjustment, the mark on the wafer stage is detected by FIA and an exposure region (e.g., stripe) on the wafer is aligned relative to the wafer stage. The wafer stage is moved, based on the detected distance between these axes. In a "fine" adjustment, the mark on the wafer stage can be detected using the CPB-based sensor, and an alignment is performed of the exposure region (e.g., stripe) on the wafer relative to the reticle or reticle stage. Alternatively, the "fine" adjustment can be performed using FIA or alternative optical-based sensing and alignment technique.

Although CPB-based sensors can provide more accurate, mark detection than optical based sensors, whenever the semiconductor device being fabricated on the wafer is made up of a large number of layers, detection accuracy obtained at certain of the layers can be poor because the sensor is unable to obtain a detection signal having an adequate signal-to-noise (S/N) ratio. Under such conditions, a more accurate alignment may be possible using an optical-based alignment-mark sensor. By using an alignment mark, according to the invention, that can be detected by both optical-based and CPB-based alignment-mark sensors, more accurate alignments can be performed by selecting the more suitable sensor for the prevailing conditions.

As noted above, the optical-based sensor can be an image-processing-type sensor. An image-processing-type sensor allows a determination of the location of the center of an alignment mark with an accuracy better than the image resolution of the optical sensor.

For measurement relative to an alignment mark on a reticle or reticle stage, a corresponding alignment mark desirably is provided on a substrate (e.g., a wafer) or a substrate stage. Under such conditions, alignment-mark detection can be performed using a CPB-based sensor, wherein the position of the alignment mark is detected by scanning the alignment mark on the substrate or substrate stage with a charged particle beam that has passed through the corresponding alignment mark on the reticle or reticle stage. I.e., the alignment mark on the reticle or reticle stage is similar in profile to the alignment mark on the substrate or substrate stage. However, the pattern of the mark on the reticle or reticle stage is larger (by the reciprocal of the demagnification ratio) than the mark pattern on the substrate or substrate stage. The maximum (or minimum) output from the sensor is obtained whenever the image of the mark pattern on the reticle or reticle stage is superposed on the alignment mark on the substrate or substrate stage. The sensor output can be analyzed, using conventional methods for determining "center of gravity" of a signal waveform, to determine the position at which the marks are exactly superposed. The reticle (or reticle stage) and substrate (or substrate stage) can be properly aligned with each other based on the amount of deflection of the charged particle beam at that point in the scan at which the image of the mark as defined on the reticle or reticle stage is superposed on the mark on the substrate or substrate stage.

The invention also provides alignment methods in which any of the various alignment marks according to the invention is defined on a substrate or substrate stage of a CPB microlithography apparatus. The substrate stage is moved; meanwhile the alignment mark is detected using one of or both an optical-based alignment-mark sensor and a CPB-based alignment-mark sensor. The distance between a reference position at which mark detection is performed using the optical-based sensor and a reference position at which mark detection is performed using the CPB-based sensor is measured from the respective sensed center positions of the mark using both types of sensors and from the amount of movement of the substrate stage from one reference position to the other. For example, the optical-based sensor can be used to perform a "coarse" measurement and alignment of the wafer, and the CPB-based sensor can be used to perform a "fine" measurement and alignment of the wafer and reticle. Such measurements are possible because the alignment mark can be detected by both types of sensors.

The optical-based sensor is located typically outside of the CPB column, while the CPB-based sensor is located inside the CPB column. However, since the distance between the respective reference positions of the optical-based sensor and CPB-based sensor can be known accurately, an accurate alignment of the reticle and substrate can be achieved using the optical-based sensor. After moving the substrate stage by an amount equal to the distance between the reference locations of the two sensors, further alignments can be performed using the CPB-based sensor without any loss of measurement accuracy.

The foregoing and additional features and advantages of the invention will be more readily understood from the following detailed description, which proceeds with reference to the accompanying drawings.

DETAILED DESCRIPTION OF REPRESENTATIVE EMBODIMENTS

Figure 1A:
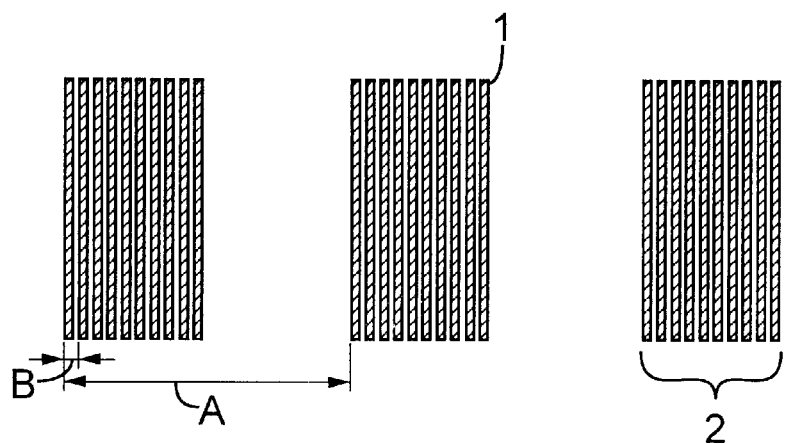
FIG. 1(a) is a plan view of an alignment mark according to a first representative embodiment of the invention.

FIG. 1(a) shows a first representative embodiment of an alignment mark according to the invention. An alignment mark having such a configuration can be formed on the wafer or wafer stage as a fiducial (or reference) mark for use by an optical-based alignment sensor and a CPB-based alignment sensor, and formed on the reticle or reticle stage for use (in conjunction with the corresponding mark on the wafer or wafer stage) by the CPB-based alignment sensor. In the FIG.-1(a) embodiment, the alignment mark comprises an array of multiple "features" or "elements" 2. Each element 2 in this embodiment comprises a regular array of ten evenly spaced linear sub-elements 1. Each sub-element 1 is 0.3 μm wide (as formed on the wafer or wafer stage) and is defined in a layer of a heavy metal such as Ta or W. The array period "A" of the elements 2 is 6 μm. The array period "B" of the sub-elements 1 is one-tenth the array period "A", or 0.6 μm.

The FIG.-1(a) mark formed on the wafer or wafer stage as a fiducial mark can be detected using an optical-based sensor (such as an "FIA" or Field-Image Alignment, sensor utilizing a CCD sensing element, as described, e.g., in U.S. Pat. No. 4,962,318, incorporated herein by reference). In FIA, the mark on the wafer or wafer stage is detected relative to an "index" mark formed on a conjugate plane of the wafer stage and CCD sensing element. An image of the mark is projected to the index mark by an optical imaging system, and the distance, in the optical field of the CCD, from the mark on the wafer (or wafer stage) to index mark is detected and measured.

Figure 1B:
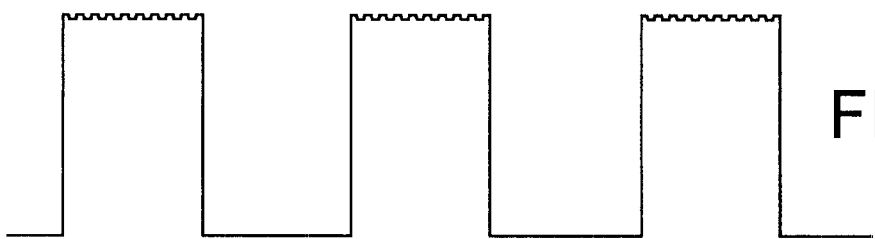
FIG. 1(b) is a representative signal waveform of the FIG.-1(a) mark detected using an optical-based alignment-mark sensor.

However, because the resolution of FIA sensors is usually on the order of 1 μm, the period-"B" pattern (i.e., the pattern of sub-elements 1 in each element 2) is, as formed on the wafer, unresolved by the sensor. Also, each of the elements 2 that constitute the period-"A" pattern is detected using an optical-based sensor as a single contiguous object not resolvable into sub-elements, as shown in FIG. 1(b). In other words, the obtained signal is substantially the same as the signal that would otherwise be obtained if each of the elements 2 lacked the sub-elements 1.

Figure 1C:
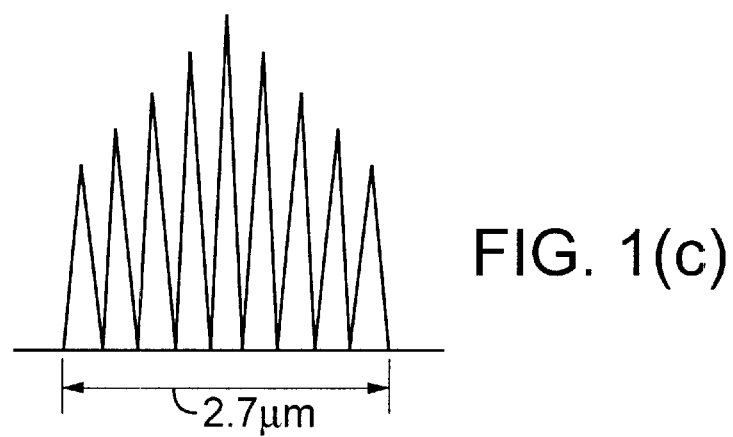
FIG. 1(c) is a representative signal waveform of the FIG.-1(a) mark detected using a CPB-based alignment-mark sensor.

On the other hand, if a CPB-based alignment-mark sensor (e.g., a sensor responsive to an electron beam) is used to detect the mark of FIG. 1(a), the mark image formed on the wafer has the period-"B" pattern resolved. Thus, such a pattern on the wafer can be scanned by an electron beam that has passed through a corresponding upstream mark (e.g. on the reticle or reticle stage) to produce a corresponding image on the mark pattern on the wafer. The resulting signal waveform is as shown in FIG. 1(c). In the example of FIG. 1(c), the scan width is 2.7 μm, with the scan centered on the point (in the scan) at which the image of the upstream mark and the alignment mark on the wafer are exactly matched. In some cases, however, signal-processing techniques can be used to reduce the shortest allowable scan width to approximately 0.5 μm. Detection signals obtained from entire marks using optical-based and CPB-based sensors can be processed to distinguish the center of the mark. Since both types of sensors thus determine the location of the center of the mark, the detection results obtained using both types of sensors are approximately the same. (Before starting an actual alignment, an initial sensor calibration desirably is performed to ensure that, for the same mark, both types of sensors will produce substantially the same detection signal.)

Figure 2A:
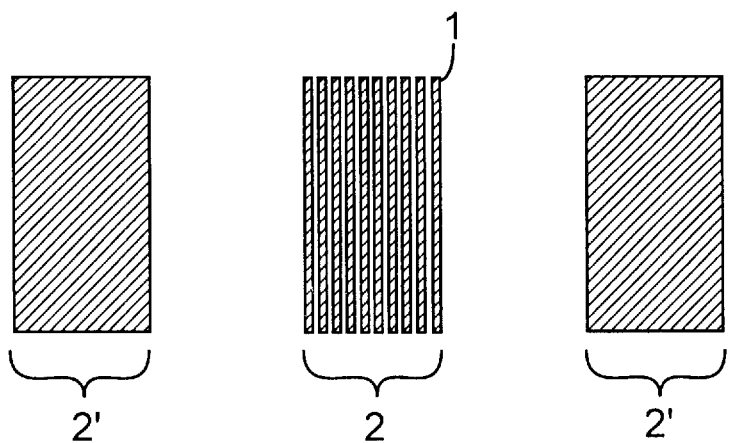
FIG. 2(a) is a plan view of an alignment mark according to a second representative embodiment of the invention.
Figure 2B:
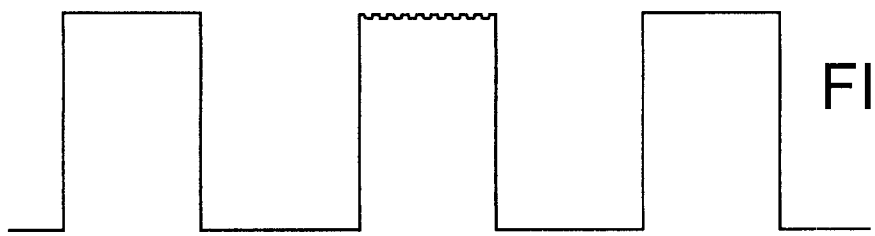
FIG. 2(b) is a representative signal waveform of the FIG.-2(a) mark detected using an optical-based alignment-mark sensor.

If a narrower scan width will suffice, an alignment-mark pattern such as that shown FIG. 2(a) can be used. The FIG.-2(a) mark has only one element 2 having sub-elements 1 as (S/N) used in the FIG.-1(a) embodiment. However, the FIG.-2(a) mark also includes two flanking elements 2' that are heavy-metal strips measuring 3 μm in width and lacking sub-elements. If the FIG.-2(a) alignment mark is sensed using an optical-based sensor (e.g., an FIA sensor), then a signal such as that shown in FIG. 2(b) is obtained. Such a signal can be subjected to the same image processing as the signal of FIG. 1(b). On the other hand, in situations in which the FIG.-2(a) mark is sensed using a CPB-based sensor (e.g., a sensor responsive to an electron beam), a reticle pattern corresponding to the pattern of the element 2 is formed as an alignment mark on the wafer. Whenever such an alignment mark on the wafer is irradiated by an electron beam passing through a corresponding mark on the reticle or reticle stage, the alignment mark on the wafer is irradiated by an image of the corresponding mark. Scanning of the electron beam over such a mark on the wafer produces a signal waveform as shown in FIG. 1(c), but having a lower signal-to-noise (S/N) ratio than the FIG.-1(c) signal.

Figure 3A:
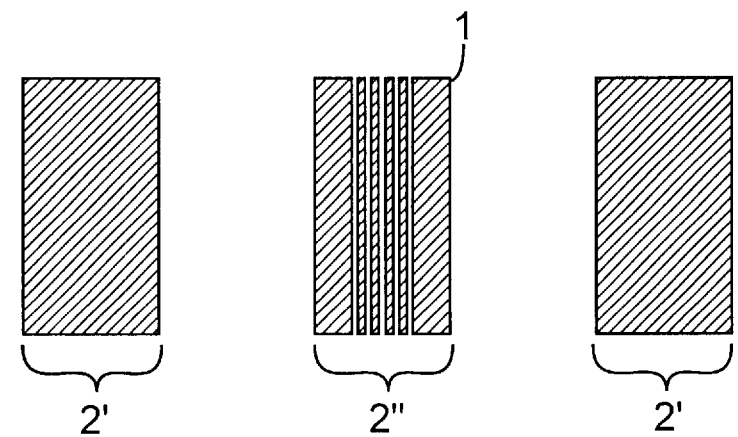
FIG. 3(a) is a plan view of an alignment mark according to a third representative embodiment of the invention.
Figure 3B:
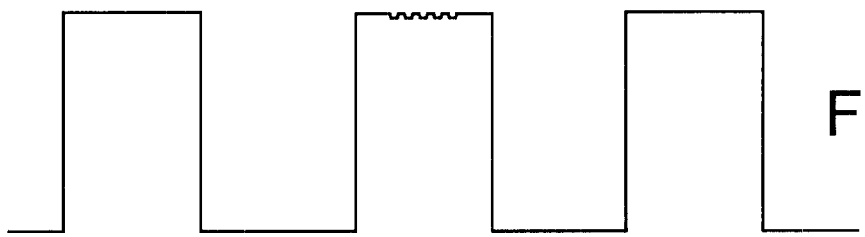
FIG. 3(b) is a representative signal waveform of the FIG.-3(a) mark detected using an optical-based alignment-mark sensor.

Yet another representative embodiment of an alignment mark is depicted in FIG. 3(a). The FIG.-3(a) mark includes two elements 2' similar to the element 2' in the FIG.-2(a) embodiment. The FIG.-3(a) mark also includes an element 2", comprising a few centrally disposed linear sub-elements 1 (made, e.g., of heavy metal) flanked by wide sub-elements (made, e.g., of heavy metal). If the FIG.-3(a) mark were to be sensed using an optical-based sensor (e.g., FIA sensor), then a signal such as that shown in FIG. 3(b) would be obtained. Such a signal can be subjected to the same image processing as the signal of FIG. 1(b). On the other hand, in situations in which the FIG.-3(a) mark is sensed using a CPB-based sensor, (e.g., a sensor responsive to an electron beam), a reticle pattern corresponding to the pattern of the element 2" is formed as an alignment mark on the wafer. Whenever such an alignment mark on the wafer is irradiated by an electron beam passing through a corresponding mark on the reticle or reticle stage, the alignment mark on the wafer is irradiated by an image of the corresponding mark. Scanning of the electron beam over such a mark on the wafer produces a signal waveform as shown in FIG. 1(c), but having a lower S/N ratio than the FIG.-1(c) signal. Whenever the scan width is narrow, satisfactory position sensing can be achieved using this type of alignment mark.

FIGS. 4(a)–4(d) depict yet other examples of alignment marks according to the invention. In the FIG.-4(a) example, each element 10 comprises five linear sub-elements 11 each having a width "L" that is different from the width "S" of the space between adjacent sub-elements. The operational effect of a FIG.-4(a) mark is the same as of a mark in which L=S.

Figure 4A:
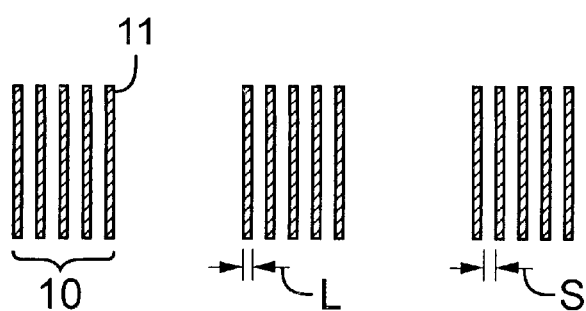
FIGS. 4(a)–4(d) are plan views of respective examples of alignment marks according to the invention.
Figure 4B:
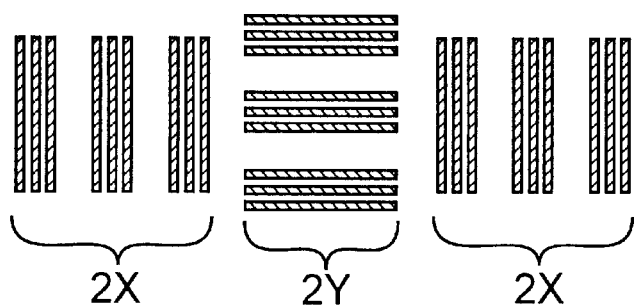
Figure 4C:
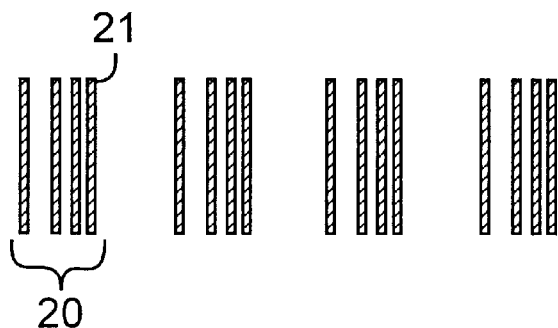
Figure 4D:
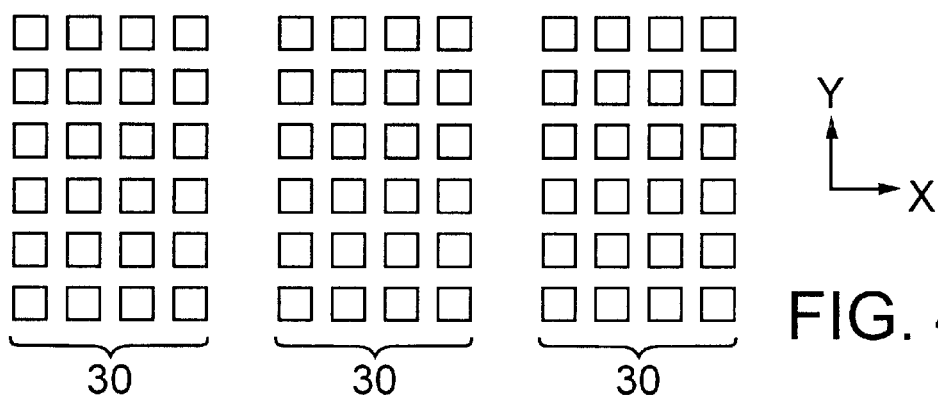
Figure 5A:
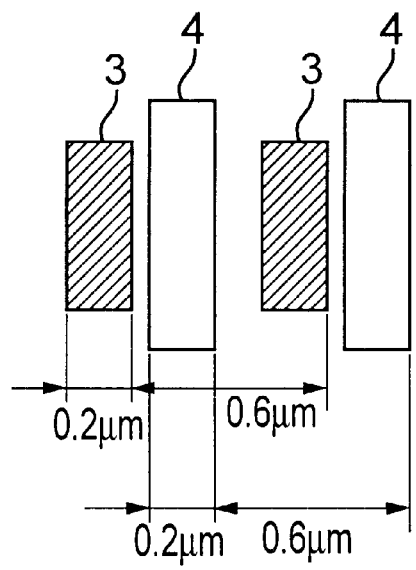
FIGS. 5(a)–5(b) depict a prior art electron-beam alignment-sensing method, and signal waveform, respectively.
Figure 5B:
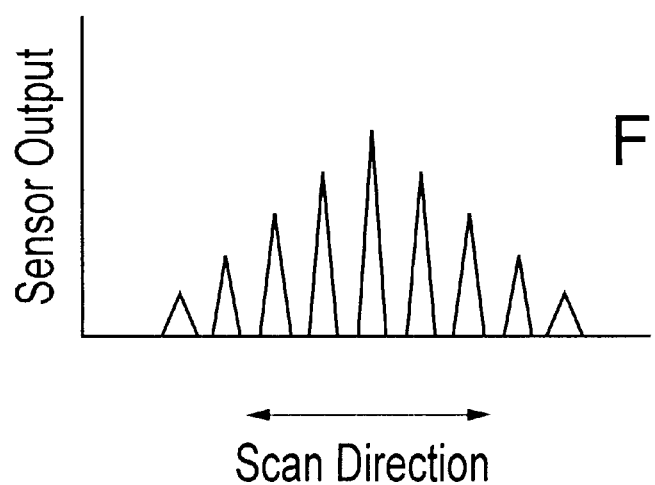

The FIG.-4(b) example comprises, in a single mark, elements 2X used for sensing in the X-axis direction (horizontal direction in the figure) and an element 2Y used for sensing in the Y-axis direction (vertical direction in the figure). The FIG.-4(b) mark permits X-direction and Y-direction alignment measurements to be performed simultaneously by FIA using an optical-based sensor. Similarly, the FIG.-4(d) mark comprises elements 30 that permit simultaneous X-direction and Y-directions sensing by FIA. With the marks of FIGS. 4(b) or 4(d), whenever a CPB-30 2based sensor is used, the detection of X-direction position and Y-direction position is performed by scanning the respective elements (e.g., elements 2X in FIG. 4(b) or any element 30 in FIG. 4(d)) in the X-direction and by scanning the respective elements (e.g., element 2Y in FIG. 4(b) or any element 30 in FIG. 4(*d*)) in the Y-direction. The FIG.-4(*d*) mark is advantageous because the overall mark can be formed using less space on the wafer stage (or wafer).

In the FIG.-4(*c*) example, the linear sub-elements 21 in each element 20 are not spaced equally from each other; rather, the spacing between adjacent sub-elements varies. Such a configuration provides a more prominent peak in the signal obtained whenever the mark is scanned using a charged particle beam (e.g., electron beam). Whenever such a mark is detected using both an optical-based sensor (e.g., FIA sensor) and a CPB-based sensor so as to achieve wafer alignment in an electron-beam microlithography system, the optical-based sensor must be positioned off-axis with respect to the optical axis of the electron-optical system used for image projection. As a result, whenever the optical-based sensor is being used for wafer alignment, the distance between the optical axis of the electron-optical system and the axis of the optical-based sensor should be calibrated. To perform such a calibration, reference marks can be provided for measuring the distance between the two optical axes. If a mark pattern according to the present invention is used for such marks, measurements can be performed on a single mark using both the optical-based sensor and the CPB-based sensor, thereby reducing positional errors.

Measuring the distance between the two optical axes also can be performed by simultaneously measuring two different marks using the optical-based sensor and the CPB-based sensor. If the marks used are configured according to the present invention, then it will be possible to calibrate the distance between the two marks using either type of sensor, thereby reducing calibration errors.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An alignment mark for use in performing an alignment during charged-particle-beam (CPB) microlithography of a pattern, defined by a reticle, to a substrate, the alignment mark comprising multiple elements including a first group of features that are detectable by an optical-based alignment-mark sensor and a CPB-based alignment-mark sensor, and a second group of features that are detectable by the CPB-based alignment mark sensor but not by the optical-based alignment-mark sensor.

2. The alignment mark of claim 1, wherein:
multiple features in the first group are identically shaped and are arranged as a serial array of elements separated from each other by a spacing interval of at least a first prescribed value; and
each feature in the first group comprises multiple features of the second group arranged as sub-elements of the respective element, wherein the sub-elements are linearly configured, serially arrayed, and separated from each other by a spacing interval no greater than a second prescribed value that is less than the first prescribed value.

3. The alignment mark of claim 2, wherein:
the spacing interval between the sub-elements is less than a resolution limit of the optical-based alignment-mark sensor and greater than a minimum beam-scan step of the CPB-based alignment-mark sensor; and
the spacing interval between the elements is greater than the resolution limit of the optical-based alignment-mark sensor.

4. The alignment mark of claim 1, wherein:
multiple features of the first group are identically shaped and are arranged as a serial array of elements separated from each other by a spacing interval of at least a first prescribed value; and
at least one of the features of the first group comprises multiple features of the second group arrayed as sub-elements of the respective element, wherein the sub-elements are linearly configured, serially arrayed, and separated from each other by one or more spacing intervals each no greater than the first prescribed value.

5. The alignment mark of claim 4, wherein:
the spacing interval between the sub-elements is less than a resolution limit of the optical-based alignment-mark sensor and greater than a minimum beam-scan step of the CPB-based alignment-mark sensor; and
the spacing interval between the elements is greater than the resolution limit of the optical-based alignment-mark sensor.

6. A body, comprising an alignment mark including multiple elements including a first group of features that are detectable by an optical-based alignment-mark sensor and a charged-particle-beam (CPB)-based alignment-mark sensor, and a second group of features that are detectable by the CPB-based alignment-mark sensor but not by the optical-based alignment-mark sensor, the body being selected from the group consisting of reticles, reticle stages, substrates, and substrate stages.

7. The body of claim 6, wherein:
multiple features in the first group are identically shaped and are arranged as a serial array of elements separated from each other by a spacing interval of at least a first prescribed value; and
each feature in the first group comprises multiple features of the second group arranged as sub-elements of the respective element, wherein the sub-elements are linearly configured, serially arrayed, and separated from each other by a spacing interval no greater than a second prescribed value that is less than the first prescribed value.

8. The body of claim 7, wherein:
the spacing interval between the sub-elements is less than a resolution limit of the optical-based alignment-mark sensor and greater than a minimum beam-scan step of the CPB-based alignment-mark sensor; and
the spacing interval between the elements is greater than the resolution limit of the optical-based alignment-mark sensor.

9. The body of claim 6, wherein:
multiple features of the first group are identically shaped and are arranged as a serial array of elements separated from each other by a spacing interval of at least a first prescribed value; and
at least one of the features of the first group comprises multiple features of the second group arrayed as sub-elements of the respective element, wherein the sub-elements are linearly configured, serially arrayed, and separated from each other by one or more spacing intervals each no greater than the first prescribed value.

10. The body of claim 9, wherein:
the spacing interval between the sub-elements is less than a resolution limit of the optical-based alignment-mark sensor and greater than a minimum beam-scan step of the CPB-based alignment-mark sensor; and
the spacing interval between the elements is greater than the resolution limit of the optical-based alignment-mark sensor.

11. A method for performing an alignment in charged-particle-beam microlithography, the method comprising:

provniding a reference mark on a substrate or substrate stage, the reference mark comprising multiple elements including a first group of features that are detectable by an optical-based alignment-mark sensor and by a CPB-based alignment-mark sensor, and a second group of features that are detectable by the CPB-based alignment mark sensor but not by the optical-based alignment-mark sensor;

detecting the reference mark on the substrate or substrate stage using a sensor selected from the group consisting of optical-based alignment-mark sensors and CPB-based alignment-mark sensors, so as to produce a corresponding detection signal; and performing an alignment based on the detection signal.

12. The method of claim 11, wherein:

the alignment is detected using an optical-based sensor; and the optical-based sensor is an image-processing-type sensor.

13. The method of claim 11, including the step of providing an alignment mark on a reticle or reticle stage, the alignment mark corresponding to the reference mark on the substrate or substrate stage, wherein:

the alignment is detected using a CPB-based sensor; and a position of the reference mark on the substrate or substrate stage is detected by scan-irradiating the reference mark with a charged particle beam that has passed through the alignment mark on the reticle or reticle stage, the reference mark on the substrate or substrate stage having a profile similar to a profile of the alignment mark on the reticle or reticle stage.

14. A method for performing an alignment in charged-particle-beam microlithography, the method comprising:

providing on a substrate or substrate stage a reference mark comprising multiple elements including a first group of features that are detectable by an optical-based alignment-mark sensor and a charged particle beam (CPB)-based alignment-mark sensor, and a second group of features that are detectable by the CPB-based alignment-mark sensor but not by the optical-based alignment-mark sensor;

moving the substrate stage while detecting movement of the substrate stage and while detecting a position of the of the reference mark using an optical-based alignment-mark sensor and a CPB-based alignment-mark sensor;

from the detected movement of the substrate stage and the detected position of the reference mark, measuring a distance between reference position of the optical-based alignment-mark sensor and the CPB-based alignment-mark sensor; and based in the measured distance, performing the alignment.

15. The method of claim 14 as used to perform an alignment of the reticle and substrate.

16. The method of claim 15, wherein mark detections performed using the optical-based alignment-mark sensor provide a coarse alignment of the substrate, and mark detections performed using the CPB-based alignment-mark sensor provide a fine alignment of the substrate.

17. The method of claim 14, wherein detection using the optical-based alignment-mark sensor is performed using an image-processing-type sensor.

18. A method for performing an alignment in charged-particle-beam microlithography, the method comprising:

providing on a substrate or substrate stage a reference mark having a configuration as the alignment mark recited in claim 4;

moving the substrate stage while detecting movement of the substrate stage and while detecting a position of the reference mark using both an optical-based alignment-mark sensor and a charged-particle-beam (CPB)-based alignment-mark sensor;

from the detected movement of the substrate stage and the detected position of the reference mark, measuring a distance between reference positions of the optical-based alignment-mark sensor and the CPB-based alignment-mark sensor; and based on the measured distance, performing the alignment.

19. The method of claim 18 as used to perform an alignment of the reticle and substrate.

20. The method of claim 19, wherein mark detections performed using the optical-based alignment-mark sensor provide a coarse alignment of the substrate, and mark detections performed using the CPB-based alignment-mark sensor provide a fine alignment of the substrate.

21. The method of claim 18, wherein detection using the optical-based alignment-mark sensor is performed using an image-processing-type sensor.

22. An alignment mark for use in performing an alignment during microlithography of a pattern, defined by a reticle, to a substrate, the alignment mark comprising multiple elements including a first group of features that are detectable by a first alignment-mark sensor using a first radiation beam and by a second alignment-mark sensor using a second radiation beam that is different from the first radiation beam, and a second group of features that are detectable by the second alignment-mark sensor using the second radiation beam but not by the first alignment-mark sensor.

23. A method for performing an alignment during microlithography of a pattern, defined by a reticle, to a substrate, comprising:

providing a reference mark on a substrate or substrate stage, the reference mark comprising multiple elements including a first group of features that are detectable by a first alignment-mark sensor using a first radiation beam and by a second alignment-mark sensor using a second radiation beam that is different from the first radiation beam, and a second group of features that are detectable by the second alignment-mark sensor using the second radiation beam but not by the first alignment-mark sensor;

detecting the reference mark on the substrate or substrate stage using a sensor selected from the group consisting of optical-based alignment-mark sensors and CPB-based alignment-mark sensors, so as to produce a corresponding detection signal; and performing an alignment based on the detection signal.

24. A method for performing an alignment during microlithography of a pattern, defined by a reticle, to a substrate, the method comprising:

providing on a substrate or substrate stage a reference mark comprising multiple elements including a first group of features that are detectable by a first alignment-mark sensor using a first radiation beam and by a second alignment-mark sensor using a second radiation beam that is different from the first radiation beam, and a second group of features that are detectable by the second alignment-mark sensor using the second radiation beam but not by the first alignment-mark sensor;

moving the substrate stage while detecting movement of the substrate stage and while detecting a position of the reference mark using an optical-based alignment-mark sensor and a CPB-based alignment-mark sensor;

from the detected movement of the substrate stage and the detected position of the reference mark, measuring a distance between reference positions of the optical-based alignment-mark sensor and the CPB-based alignment-mark sensor; and based on the measured distance, performing the alignment.

* * * * *

UNITED STATES PATENT AND TRADEMARK OFFICE
CERTIFICATE OF CORRECTION

PATENT NO.   : 6,521,900 B1                                                   Page 1 of 1
DATED            : February 18, 2003
INVENTOR(S)  : Hirayanagi It is certified that error appears in the above-identified patent and that said Letters Patent is hereby corrected as shown below:

Column 8,
Line 62, "CPB-302based" should be -- CPB-based --.

Column 11,
Line 47, "of the of the" should be -- of the --.

Signed and Sealed this

Twenty-third Day of December, 2003

JAMES E. ROGAN
*Director of the United States Patent and Trademark Office*